United States Patent
Wu et al.

(10) Patent No.: US 7,109,564 B2
(45) Date of Patent: Sep. 19, 2006

(54) LOW POWER FUSE STRUCTURE AND METHOD OF MAKING THE SAME

(75) Inventors: Shien-Yang Wu, Hsin-Chu (TW); Shi-Bai Chen, Tai-Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 33 days.

(21) Appl. No.: 10/805,747

(22) Filed: Mar. 22, 2004

(65) Prior Publication Data
US 2005/0218475 A1   Oct. 6, 2005

(51) Int. Cl.
*H01L 29/00* (2006.01)
(52) U.S. Cl. .................. 257/529; 257/379
(58) Field of Classification Search ......... 257/529, 257/379
See application file for complete search history.

(56) References Cited

U.S. PATENT DOCUMENTS

| | | | |
|---|---|---|---|
| 5,854,510 A | 12/1998 | Sur, Jr. et al. | |
| 5,882,998 A | 3/1999 | Sur, Jr. et al. | |
| 6,242,790 B1 | 6/2001 | Tsui et al. | |
| 6,436,738 B1 | 8/2002 | Yu et al. | |
| 6,642,601 B1 * | 11/2003 | Marshall et al. | 257/529 |
| 6,661,330 B1 * | 12/2003 | Young | 337/297 |
| 6,670,824 B1 | 12/2003 | Goodbread et al. | |

* cited by examiner

*Primary Examiner*—Mark V. Prenty
(74) *Attorney, Agent, or Firm*—Haynes and Boone, LLP

(57) ABSTRACT

A fuse comprises a silicide element disposed above a substrate, a first terminal contact coupled to a first end of the silicide element, and a first metal line disposed above the silicide element and coupled to the first terminal contact. The fuse further comprises a plurality of second terminal contacts coupled to a second end of the silicide element, and a second metal line disposed above the silicide element and coupled to the plurality of second terminal contacts. The silicide element has a sufficient width that a programming potential applied across the first and second metal lines causes a discontinuity in the first terminal contact.

18 Claims, 3 Drawing Sheets

LOW POWER FUSE STRUCTURE AND METHOD OF MAKING THE SAME

BACKGROUND

Polysilicon or poly fuse structures have been formed in integrated circuits that may function as memory devices. These fuse structures can be "programmed" by passing a high current that causes its silicide structure to break down. In the programmed state, the fuse structure has a resistance that is greater than in its non-programmed state. Because traditional polysilicon fuses require a high voltage potential to program the fuse, they are unsuited to low power applications.

DETAILED DESCRIPTION

Figure 1:
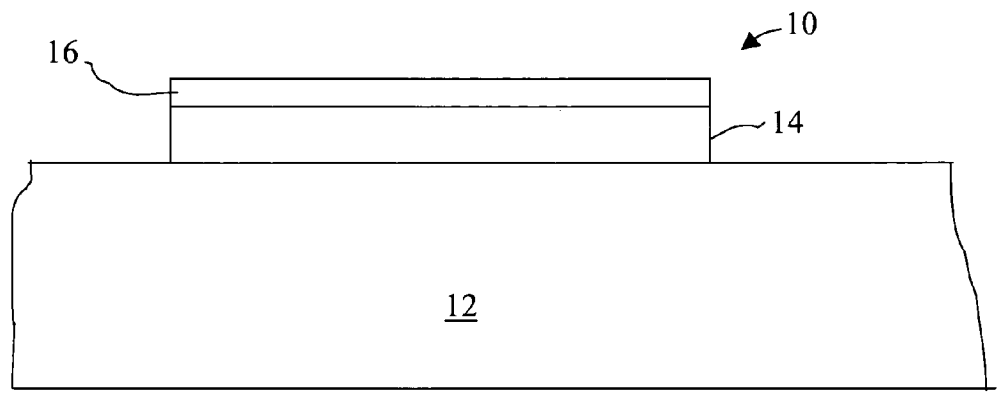
FIGS. 1 and 2 are cross-sectional views of a fuse structure in various stages of fabrication according to an embodiment of the invention.

Referring to FIG. 1, a cross-sectional view of a fuse structure 10 having a substrate 12. A polysilicon or poly layer 14 is formed over substrate 12. Polysilicon layer 14 may be doped with any suitable n-type or p-type impurities or may be undoped. A silicide layer 16 is formed above polysilicon layer 14. Silicide layer 16 may be formed by thermally reacting a variety of metals with silicon, such as titanium, tungsten, cobalt, nickel, tantalum, platinum, chromium, molybdenum, etc. Polysilicon layer 14 and silicide layer 16 may have the same planar dimensions, such as width and length, but silicide layer 16 may have a thickness less than that of polysilicon layer 14. Alternatively, silicide layer 16 may be formed over an active region in substrate 12 rather than a polysilicon layer 14. Conventional fabrication methods or new processes may be used to form substrate 12, polysilicon layer 14 and silicide layer 16.

Figure 2:
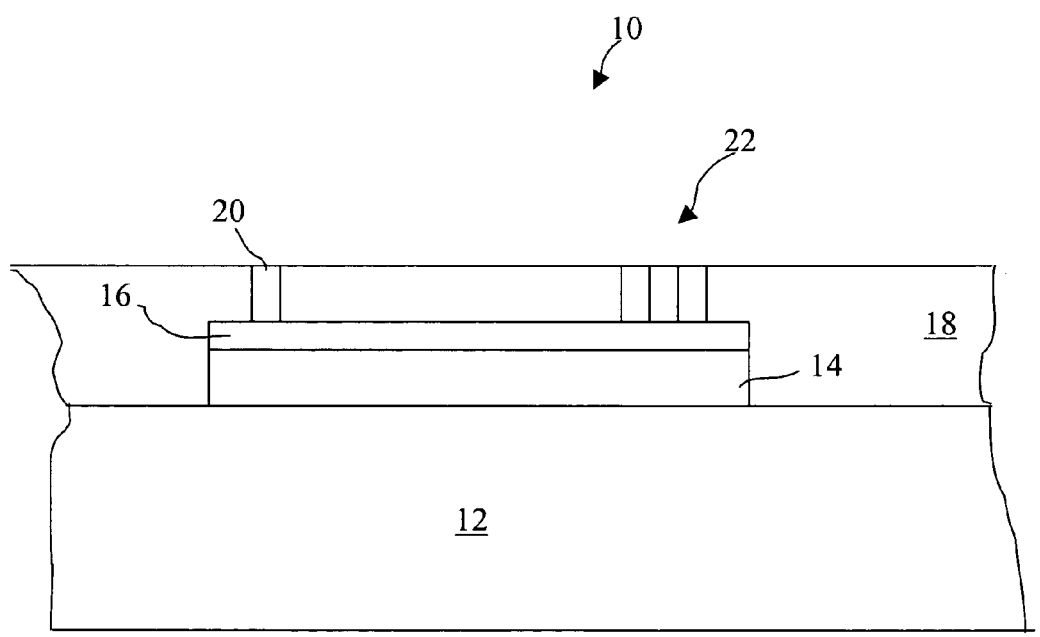
Figure 4:
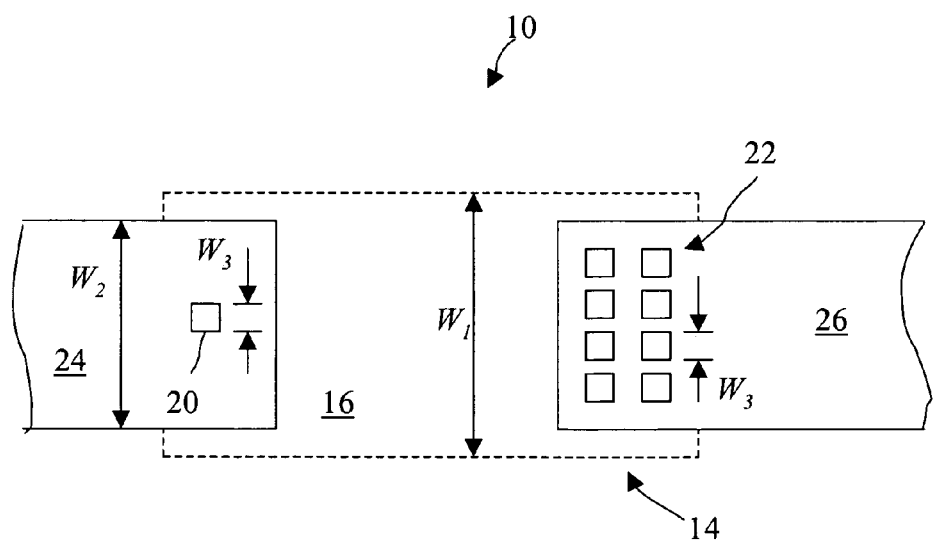
FIG. 4 is a top plan view of a fuse structure according to an embodiment of the invention.

Referring to FIG. 2, an oxide layer 18 is formed over silicide layer 16 and substrate 12. A single via and contact 20 is formed to electrically couple one end of silicide layer 16. A plurality of contacts 22 are formed to electrically couple a second end of silicide layer 16. Contacts 22 may be arranged in an array, a matrix, or another suitable formation. As shown in the exemplary plan view in FIG. 4, the plurality of contacts 22 comprise eight vias of similar dimensions though other suitable configurations and numbers of contacts may be used. Contacts 20 and 22 may be formed of one or more suitable metals such as tungsten, aluminum, copper, etc.

Figure 3:
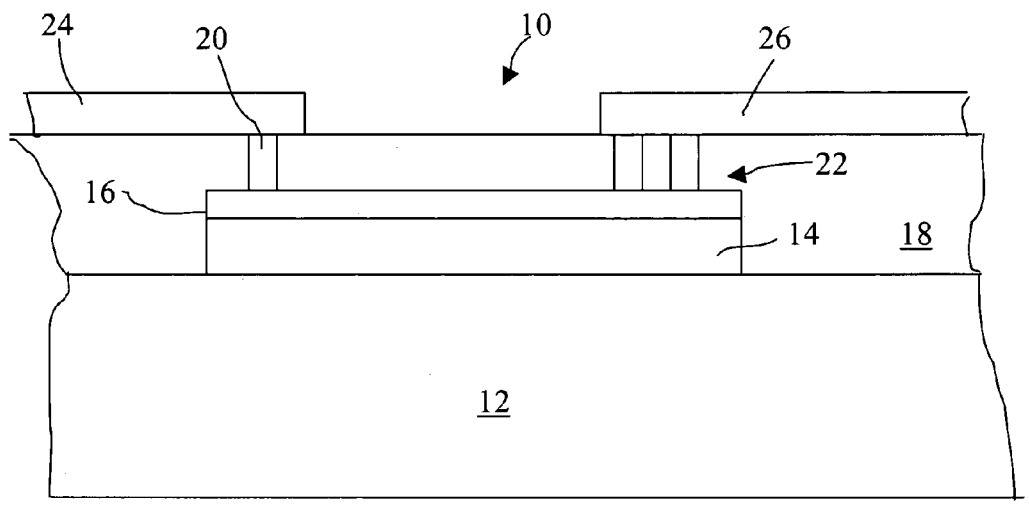
FIG. 3 is a cross-sectional view of a fuse structure according to an embodiment of the invention.

Referring to FIG. 3, metal lines 24 and 26 are formed to electrically couple to single contact 20 and plurality of contacts 22, respectively. It may be seen from a plan view of fuse structure 10 in FIG. 4 that silicide layer 16 has a width $W_1$, and metal lines 24 and 26 have a width of $W_2$. The widths of silicide layer 16 and metal lines 24 and 26 are such that silicide layer 16 does not exhibit significantly higher resistance than that of metal lines 24 and 26. In an embodiment shown in FIG. 4, the silicide layer width, $W_1$, is preferably four to eight times larger than the contact width, $W_3$, and the metal line width, $W_2$, is preferably at least two to three time larger than the contact width, $W_3$. In comparison, the cross-sectional area of contact 20 is significantly less than that of the metal lines, the silicide layer, or the combined cross-sectional area of the plurality of contacts 22.

When a programming potential is applied across metal lines 24 and 26, a current flows from metal line 26 to the plurality of contacts 22, and then to the single contact 20 via silicide layer 16. Due to the small cross-sectional area of contact 20 in comparison with the combined cross-sectional areas of contacts 22 and also silicide layer 16, a phenomenon known as electromigration occurs in contact 20. Electromigration describes the migration of atoms in contact 20 due to momentum transfer from the electrons, which move in the applied electric field, to the ions which make up the lattice of the metal. A result of electromigration is failure of the metal in contact 20, which causes a discontinuity or open circuit therein. The material of contact 20 and its fabrication are preferably selected so that failure caused by electromigration in contact 20 occurs at a small current flow and low applied voltage. For example, it may be preferable that programming of the fuse occurs at about 2 volts and 4 to 5 milliamperes (mA). Once fuse structure 10 is programmed or blown, it exhibits an open circuit condition with substantially infinite resistance.

Figure 5:
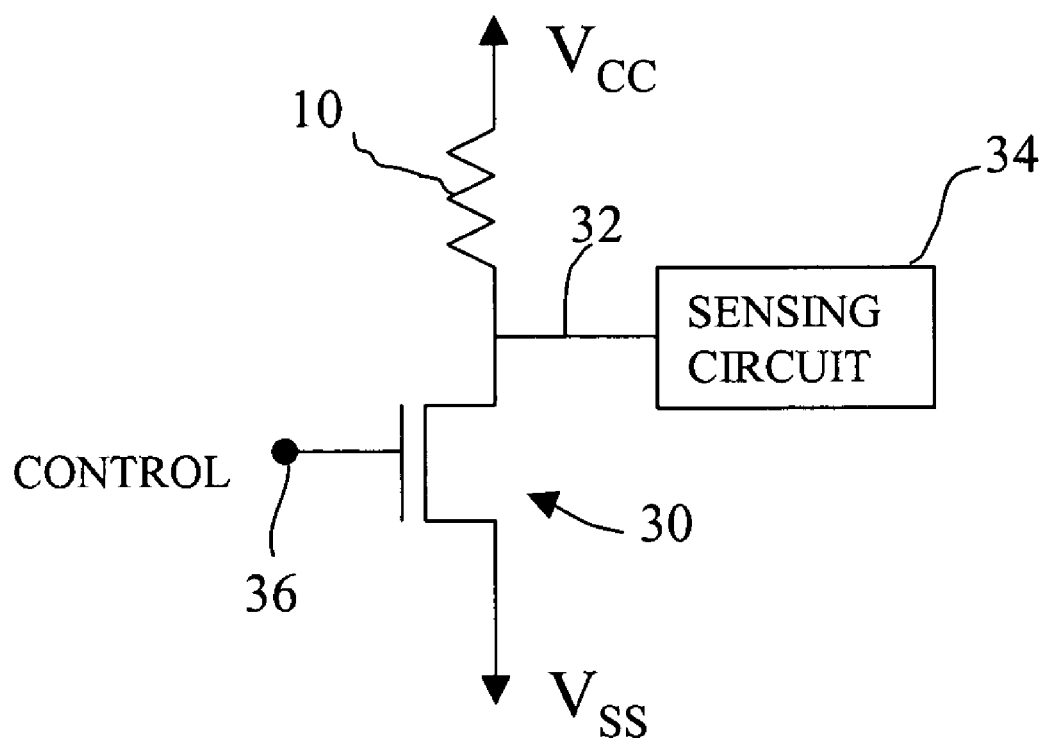
FIG. 5 is a schematic diagram of a fuse with a driver transistor according to an embodiment of the invention.

Referring to FIG. 5, fuse structure 10 is represented by a resistor symbol in the schematic diagram. One terminal of fuse 10 is coupled to a supply voltage, $V_{CC}$, and its second terminal is coupled to the drain terminal of an n-channel MOSFET (metal oxide semiconductor field effect transistor) 30. The source terminal of MOSFET 30 is coupled to $V_{SS}$ or ground. MOSFET 30 is an example of a driver device operable to supply a programming current and voltage drop across fuse 10. A control signal is supplied to a gate terminal 36 of MOSFET 30 that is operable to turn the transistor ON or OFF. An output signal 32 at the drain terminal of MOSFET 30 is supplied to a sensing circuit 34 that is operable to determine whether fuse 10 is programmed. Because the resistance differential of fuse 10 between its unprogrammed state and its programmed state is large, sensing circuit 34 is likely to have simple construction.

Although an n-channel MOSFET has been shown in this example, a p-channel MOSFET or another suitable driver device may be used. It is preferable that the driver device is simple in structure and does not require additional processing steps to fabricate.

In operation, when fuse 10 is in the unprogrammed state, it exhibits a low resistance. Therefore, the output voltage level at the drain of MOSFET 30 is near the supply voltage level. To program fuse 10, a control signal is supplied to gate terminal 36 of driver device or MOSFET 30 that turns on MOSFET 30. A voltage drop of substantially $V_{CC}$ is thus applied across fuse 10 and a current flows through fuse 10. The small single contact 20 (FIG. 4) of fuse structure 10 is forced to bear the current flow and thus breaks down. A discontinuity is formed in contact 20 and fuse 10 generally becomes an open circuit or its resistance becomes very high. Therefore, sensing circuit 34 may detect a voltage level approximating $V_{CC}$ when fuse 10 is in an unprogrammed state, and a floating or very low voltage level when fuse 10 is in a programmed state.

An advantage of fuse structure 10 is its low programming requirements. Low programming potential and current are sufficient to convert the fuse from a unprogrammed state with low resistance to a programmed state with high resistance. The fabrication of fuse structure 10 is compatible with single core oxide processes and does not require additional processing steps. Further, fuse structure 10 does not have the characteristic polysilicon fuse bow-tie shape that easily gives away its presence and thus enhances the security of information contained therein.

What is claimed is:

1. A fuse comprising:
   a silicide element disposed above a substrate;
   a first terminal contact coupled to a first end of the silicide element;
   a first metal line disposed above the silicide element and coupled to the first terminal contact;
   a plurality of second terminal contacts coupled to a second end of the silicide element;
   a second metal line disposed above the silicide element and coupled to the plurality of second terminal contacts; and
   the silicide element having a sufficient width that a programming potential applied across the first and second metal lines causes a discontinuity in the first terminal contact, wherein a plan view of the silicide element is generally rectangular in shape.

2. The fuse, as set forth in claim 1, further comprising a polysilicon layer disposed below the silicide element.

3. The fuse, as set forth in claim 1, further comprising an active region disposed below the silicide element.

4. The fuse, as set forth in claim 1, wherein a width of the first metal line is at least two times greater than a width of the first terminal contact, and a width of the silicide element is at least four times larger than the first terminal contact width.

5. The fuse, as set forth in claim 1, wherein a width of the second metal line is at least two times greater than a width of the second terminal contact, and a width of the silicide element is at least four times larger than the second terminal contact width.

6. The fuse, as set forth in claim 1, wherein a cross-sectional area of the first terminal contact is significantly less than a cross-sectional area of the silicide element.

7. The fuse, as set forth in claim 1, wherein a cross-sectional area of the first terminal contact is significantly less than a combined cross-sectional area of the plurality of second terminal contacts.

8. The fuse, as set forth in claim 1, wherein the first terminal contact and the plurality of second terminal contacts comprises metal.

9. The fuse, as set forth in claim 1, wherein each of the plurality of second terminal contacts and the first terminal contact are equal in size.

10. The fuse, as set forth in claim 1, further comprising a transistor coupled to the first metal line operable to induce a programming current in the fuse.

11. A semiconductor fuse comprising:
    a silicide strip disposed above a substrate;
    a first terminal contact electrically coupled to a first end of the silicide strip;
    a plurality of second terminal contacts electrically coupled to a second end of the silicide strip;
    the silicide strip having a sufficient width that a programming potential applied across the first terminal contact and the plurality of second terminal contacts causes an increased resistance across the first terminal contact and the plurality of second terminal contacts, wherein a plan view of the silicide strip is generally rectangular in shape.

12. The semiconductor fuse, as set forth in claim 11, further comprising a polysilicon layer disposed below the silicide strip.

13. The semiconductor fuse, as set forth in claim 11, further comprising an active region disposed below the silicide strip.

14. The semiconductor fuse, as set forth in claim 11, wherein a cross-sectional area of the first terminal contact is significantly less than a cross-sectional area of the silicide strip.

15. The semiconductor fuse, as set forth in claim 11, wherein a cross-sectional area of the first terminal contact is significantly less than a combined cross-sectional area of the plurality of second terminal contacts.

16. The semiconductor fuse, as set forth in claim 11, wherein the first terminal contact and the plurality of second terminal contacts comprises metal.

17. The semiconductor fuse, as set forth in claim 11, wherein each of the plurality of second terminal contacts and the first terminal contact are equal in size.

18. The semiconductor fuse, as set forth in claim 11, further comprising a transistor coupled to the first terminal contact operable to induce a programming current between the first terminal contact and the plurality of second terminal contacts through the silicide strip.

* * * * *